US008878580B1

(12) United States Patent
Gaskins et al.

(10) Patent No.: US 8,878,580 B1
(45) Date of Patent: Nov. 4, 2014

(54) APPARATUS AND METHOD FOR GENERATING A CLOCK SIGNAL WITH REDUCED JITTER

(71) Applicant: VIA Technologies, Inc., New Taipei (TW)

(72) Inventors: Darius D. Gaskins, Austin, TX (US); James R. Lundberg, Austin, TX (US)

(73) Assignee: VIA Technologies, Inc., New Taipei (TW)

( * ) Notice: Subject to any disclaimer, the term of this patent is extended or adjusted under 35 U.S.C. 154(b) by 0 days.

(21) Appl. No.: 14/030,560

(22) Filed: Sep. 18, 2013

Related U.S. Application Data

(60) Provisional application No. 61/857,013, filed on Jul. 22, 2013.

(51) Int. Cl.
*H03L 7/06* (2006.01)

(52) U.S. Cl.
USPC .......................................... 327/156; 327/147

(58) Field of Classification Search
CPC .......... H03L 7/0891; H03L 7/18; H03L 7/093
USPC ................................................ 327/147, 156
See application file for complete search history.

(56) References Cited

U.S. PATENT DOCUMENTS

| | | | | |
|---|---|---|---|---|
| 5,828,255 | A * | 10/1998 | Kelkar et al. | 327/157 |
| 7,924,072 | B2 * | 4/2011 | Palmer et al. | 327/156 |
| 8,102,196 | B1 * | 1/2012 | Zhang | 327/156 |
| 8,536,911 | B1 * | 9/2013 | Nakamuta et al. | 327/156 |
| 2003/0098731 | A1 * | 5/2003 | Tabatabaei et al. | 327/160 |
| 2004/0263223 | A1 * | 12/2004 | Wong et al. | 327/156 |
| 2005/0267696 | A1 * | 12/2005 | Yamaguchi et al. | 702/57 |
| 2008/0247451 | A1 * | 10/2008 | Yamaguchi | 375/226 |
| 2013/0086410 | A1 * | 4/2013 | Kurd et al. | 713/501 |
| 2013/0241610 | A1 * | 9/2013 | Nakamuta et al. | 327/156 |

OTHER PUBLICATIONS

Kurd, Nasser et al. "Next Generation Intel® Core™ Micro-Architecture (Nehalem) Clocking." IEEE Journal of Solid-State Circuits, vol. 44, No. 4, Apr. 2009 pp. 1121-1129.

* cited by examiner

*Primary Examiner* — Adam Houston
(74) *Attorney, Agent, or Firm* — Gary Stanford; James W. Huffman (57) ABSTRACT

A clock system receiving a reference clock signal via an alignment location and developing a functional clock signal provided to a functional circuit via a clock path. The clock system includes a low bandwidth PLL, a high bandwidth PLL, and a delay path. The low bandwidth PLL receives the reference clock signal and a feedback clock signal and provides a filtered clock signal. The high bandwidth PLL receives the filtered clock signal and provides the functional clock signal, and has a feedback input coupled to its output via a local feedback path. The delay path is coupled between the output of the low bandwidth PLL and the alignment location to provide the feedback clock signal to the low bandwidth PLL. The delay and clock paths are substantially matched. The bandwidths of the low and high bandwidth PLLs may be individually configured to reduce both input jitter and internal jitter, respectively.

24 Claims, 3 Drawing Sheets

APPARATUS AND METHOD FOR GENERATING A CLOCK SIGNAL WITH REDUCED JITTER

CROSS REFERENCE TO RELATED APPLICATION(S)

This application claims priority to the following U.S. Provisional Patent Application which is hereby incorporated by reference in its entirety for all intents and purposes.

| SER. NO. | FILING DATE | TITLE |
|---|---|---|
| 61/857,013 (CNTR.2685) | Jul. 22, 2013 | APPARATUS AND METHOD FOR GENERATING A CLOCK SIGNAL WITH REDUCED JITTER |

BACKGROUND OF THE INVENTION

1. Field of the Invention

The present invention relates in general to clock generation, and more particularly to generating clock signals with reduced jitter using a low bandwidth phase-locked loop with a matched clock delay path, and using at least one high bandwidth phase-locked loop with local feedback paths to minimize jitter.

2. Description of the Related Art

A conventional clock generation system typically includes at least one phase-locked loop (PLL) that multiplies the frequency of a reference clock to generate one or more higher frequency clock signals. The clock signals are used for synchronization or other timing purposes and are provided to functional circuitry on an integrated circuit (IC) or semiconductor chip or the like. Each clock signal generated by a corresponding PLL is routed back to a feedback input of that PLL, which attempts to align phase and frequency of the reference and feedback clock signals. Although the reference and output clock signals may have the same frequency, a frequency divider (fixed or programmable) in the feedback path may be used to increase the frequency of the output clock relative to the frequency of the reference clock. Thus, each PLL may be used to multiply frequency to provide a high frequency clock signal.

The functional circuitry depends upon the type of chip or system. A microprocessor chip, for example, typically includes one or more processing cores, one or more memory arrays (e.g., L1 and L1 cache memories), various processor support circuitry and functions, various input/output (I/O) functions, etc. Each clock signal developed by a PLL are distributed throughout the chip via a clock distribution system including conductive traces or the like.

The reference clock may be provided from an external source and typically includes a certain level of input noise contributing to a first type of jitter, referred to herein as input jitter. Jitter is an undesired deviation or variation of clock edges from cycle to cycle. Input jitter is also jitter developed along feedback clock paths and provided to the feedback inputs of each PLL. Input jitter may be caused by thermal noise generated on the chip or temperature gradients across the chip. The clock distribution system may incorporate conductive traces, buffers, inverters, and/or clock repeaters or the like that are used to distribute the clock across the system, such as a semiconductor die. These clock tree devices introduce delays that vary over time, voltage and temperature gradients in which the variations contribute to clock jitter. The supply voltages (e.g., VDD and VSS) may have significant variations across the chip or clock system causing clock edge timing variations thereby contributing to clock jitter from cycle to cycle. Also, temperature gradients across the chip contribute to input jitter. The input jitter (or feedback input jitter) is transferred to the output of the PLL and fed back in the PLL control loop.

A second type of jitter is referred to herein as "internal" jitter, which is jitter generated by or otherwise within the PLL itself. The internally generated noise is caused by a variety of sources, including, for example, circuit components, such as the charge pump, the voltage-controlled oscillator (VCO), etc., as well as external sources, such as the power supply. The internal noise is also caused by thermal noise within the PLL or supply voltage variations applied to components of the PLL. It is undesirable for this internal jitter to be propagated to the output of the PLL.

The overall jitter is the sum of the first (input) and second (internal) types of jitter. In a conventional configuration, the designer attempted to reduce the jitter by adjusting the bandwidth of the PLL. The bandwidth of the PLL may be set or otherwise adjusted by the designer and is largely independent of the frequency. A low bandwidth PLL filters or otherwise attenuates the input jitter, but generally passes the internal jitter. A high bandwidth PLL filters the internal jitter but generally passes the input jitter. Thus, the designer of the PLL was forced to compromise on the bandwidth and was unable to reduce both types of jitter at the same time. Although both input jitter and internal jitter may have been attenuated to some degree with bandwidth adjustment, the sum of the two types of jitter was often still significant. Consequently, the system had to be designed to operate at a higher frequency with the appropriate frequency margin to tolerate the worst case jitter to ensure proper operation.

It is desired to improve the spectral integrity of distributed clock signals by reducing jitter. Reducing jitter relaxes the frequency design constraint and allows for improved efficiency and performance.

SUMMARY OF THE INVENTION

A clock system according to one embodiment of the present invention receives a reference clock signal via an alignment location and develops a functional clock signal that is provided to a functional circuit via a clock path. The clock system includes a low bandwidth PLL, a high bandwidth PLL, and a delay path. The low bandwidth PLL has a reference input for receiving the reference clock signal, has a feedback input receiving a feedback clock signal, and has an output providing a filtered clock signal. The high bandwidth PLL has a reference input receiving the filtered clock signal, has an output for providing the functional clock signal, and has a feedback input coupled to the output of the high bandwidth PLL via a local feedback path. The delay path is coupled between the output of the low bandwidth PLL and the alignment location for providing the feedback clock signal to the low bandwidth PLL. The delay path is configured to have a delay that substantially matches the clock path carrying the functional clock signal.

The bandwidths of the low and high bandwidth PLLs may be predetermined or otherwise configured, adjusted, selected or otherwise programmed to reduce jitter. In one embodiment, the bandwidth of the low bandwidth PLL is selected to reduce or otherwise minimize input jitter, and the bandwidth of the high bandwidth PLL is selected to reduce or otherwise minimize input internal jitter. The relative bandwidth between the low and high bandwidth PLLs depends upon the particular configuration and both may be adjustable by the designer.

In one embodiment, the low bandwidth PLL generates the filtered clock signal at a frequency that is approximately the same as a frequency of the reference clock signal, and the high bandwidth PLL generates the functional clock signal at a frequency that is greater than a frequency of the filtered clock signal. For example, a multiplier or the like may be incorporated within or otherwise associated with high bandwidth PLL to provide a programmable output frequency. In one embodiment, the low bandwidth PLL generates the filtered clock signal at a frequency that is about the same as the frequency of the reference clock signal, whereas the high bandwidth PLL generates the functional clock signal at a frequency that is greater than that of the filtered clock signal. The high bandwidth PLL may have a programmable frequency multiplier, such as between 2× to 32× the frequency of the input reference frequency.

The local feedback path of the high bandwidth PLL is exposed to substantially the same voltages and substantially the same temperatures as the high bandwidth PLL itself. The local feedback path may be a very short conductive path between the output and feedback input of the high bandwidth PLL, so that it is generally not subjected to any jitter-producing sources.

The delay path carrying the feedback signal between the output of the low bandwidth PLL and the alignment location is configured to match the clock path carrying the functional clock signal. In one embodiment, for example, the delay path is configured to have substantially the same timing delay and electrical characteristics as the clock path. In addition, the delay path may be configured to have the same number of buffers as the clock path. Although the alignment location may be at the input of the low bandwidth PLL, it may also be at a pad or the like which is separated from the low bandwidth PLL. In that case, two matched clock paths may be provided for conveying the reference clock signal and the feedback clock signal between the pad and the low bandwidth PLL.

The clock system may include multiple high bandwidth PLLs providing multiple functional clock signals to one or more functional circuits via one or more clock paths. For example, each functional circuit may receive a corresponding functional clock signal, or a clock distribution circuit or the like may be include for selecting from among the functional clock signals for a given functional circuit.

Various clock paths of the clock system are matched with each other to provide substantially similar delay.

The clock system may be implemented on an integrated circuit. In one embodiment, the integrated circuit includes at least one functional circuit, a pad receiving and forwarding an external reference clock signal and receiving and forwarding a feedback clock signal, a low bandwidth PLL, at least one high bandwidth PLL, at least one clock distribution path, and a feedback clock path. The low bandwidth PLL has a reference input receiving the reference clock signal, has a feedback input receiving the feedback clock signal, and has an output providing a filtered clock signal. Each high bandwidth PLL has a reference input receiving the filtered clock signal, has an output providing a corresponding functional clock signal, and has a feedback input coupled to its output via a local feedback path. Each clock distribution path conveys a corresponding functional clock signal to a corresponding functional circuit. The feedback clock path is coupled between the output of the low bandwidth PLL and an input of the pad providing the feedback clock signal. The feedback clock path and each clock distribution path are matched with each other. The integrated circuit may further include clock distribution circuitry. The integrated circuit may be a microprocessor chip or the like including one or more microprocessor cores.

A method of reducing jitter of a clock signal according to an embodiment of the present invention includes filtering a reference clock and a feedback clock received from an alignment location using a low bandwidth PLL which provides a filtered clock, conveying the filtered clock to the reference input of a high bandwidth PLL that provides a functional clock via an output, coupling the output and a feedback input of the high bandwidth PLL together via a local path, conveying the functional clock to a functional block along a clock distribution path, providing a feedback path that is matched with the clock distribution path from the low bandwidth PLL to the alignment location, and conveying the filtered clock on the feedback path to provide the feedback clock to the low bandwidth PLL.

The method may include conveying the reference clock and the feedback clock from the alignment location to the low bandwidth PLL via matching paths. The method may include configuring a bandwidth of the low bandwidth PLL to reduce input jitter, and configuring a bandwidth of the high bandwidth PLL to reduce internal jitter. The method may include configuring the high bandwidth PLL with a programmable multiplier to multiply a frequency of the filtered clock signal to develop a frequency of the functional clock signal. The method may include providing the local path within the same temperature gradients and voltages as the high bandwidth PLL.

BRIEF DESCRIPTION OF THE DRAWINGS

The benefits, features, and advantages of the present invention will become better understood with regard to the following description, and accompanying drawings where.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

The inventor has recognized the inefficiencies associated with conventional clock generation using a high bandwidth phase-locked loop (PLL). He has therefore developed a clock system and method that filters a substantial portion of clock jitter using a low bandwidth PLL with a single matched clock delay path and at least one high bandwidth PLL. Each high bandwidth PLL uses a filtered clock signal at the output of the low bandwidth PLL as the reference clock. The low bandwidth PLL aligns frequency and phase of the filtered clock signal using the matched clock delay path. Furthermore, the output of each high bandwidth PLL is locally fed back to its feedback clock input without being distributed across the IC, so that jitter on the feedback path of each high bandwidth PLL is minimal. The output or "functional" clocks are distributed via clock paths to functional circuitry, in which the delay of each clock path is matched with the single matched clock delay path of the low bandwidth PLL. Since the input jitter filtered by the low bandwidth PLL and internal jitter is filtered by each high bandwidth PLL, the overall jitter may be minimized as compared to conventional configurations.

Figure 1:
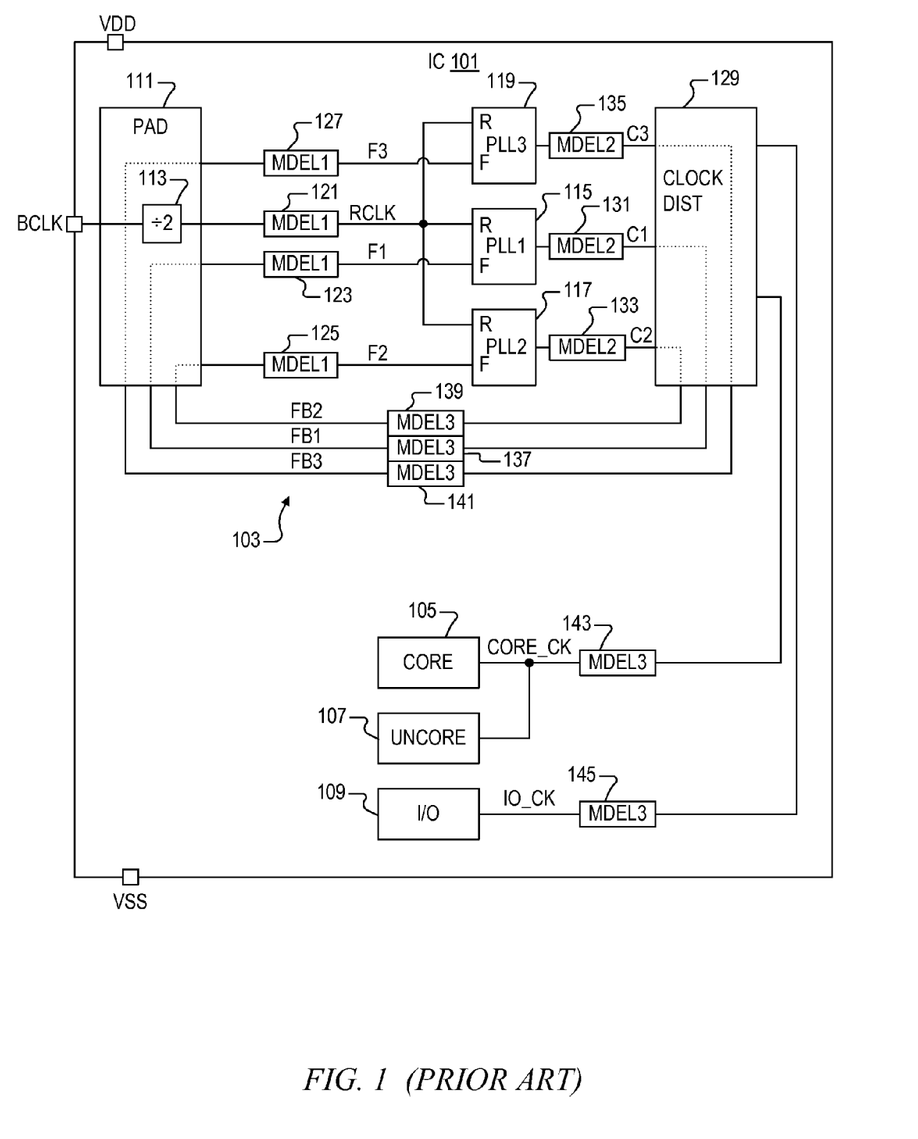
FIG. 1 is simplified block diagram of an integrated circuit incorporating clock generation circuitry implemented according to a conventional configuration.

FIG. 1 is simplified block diagram of an integrated circuit (IC) 101 incorporating clock generation circuitry 103 implemented according to a conventional configuration. The IC 101 may include electronic circuitry configured to perform any suitable electronic function, such as processing or communications or the like. In the illustrated embodiment, the IC 101 is implemented as a microprocessor chip including a core 105, "uncore" circuitry 107, and input/output (I/O) circuitry 109. Additional functional circuits or blocks may be included in particular configurations. In one embodiment, for example, the IC 101 may implement a multiple-core (multi-core) microprocessor with additional microprocessor cores. Thus, the core 105 represents any number of core blocks of the IC 101. The core 105 may include internal functional blocks (not shown), such as memory arrays, such as a read-only memory (ROM), random access memory (RAM) (e.g., cache memories), one or more arithmetic/logic units (ALU), floating point units (FPU), integer units, etc. The uncore circuitry 107 incorporates additional supporting functional circuitry provided outside the core 105. The I/O circuitry 109 generally includes the interface circuitry associated with interfacing external devices via interface pins and pads or the like.

The IC 101 includes power supply inputs (e.g., pins or the like) for coupling to supply voltages VDD and VSS, in which VDD has a suitable operating voltage for a given technology and VSS is a reference voltage such as ground. In one embodiment, the supply voltage VDD is approximately 1 Volt (V), or about 1.05V for full power mode. It is understood that the particular voltage levels may be different for different semiconductor technologies and that these specific voltage levels are exemplary only. The present disclosure is equally applicable to various technologies at different voltage levels. It is understood that the particular nominal VDD level depends upon the implementation or particular power mode and may be different in different embodiments.

The IC 101 further includes a clock input for receiving an external clock shown as BCLK (e.g., a bus clock). BCLK is provided to an internal pad (PAD) 111 for interfacing, conveying and aligning clock signals (frequency and phase) as further described herein. The PAD 111 thus serves as a phase (and/or frequency) alignment location. In one embodiment, BCLK is conveyed at its received frequency level. Alternatively, the frequency of BCLK is adjusted (e.g., decreased), such as provided to a frequency divider 113, which, in the illustrated embodiment, divides the frequency of BCLK by 2. BCLK is conveyed via a clock path as a reference clock RCLK to the reference clock inputs (R) of at least one phase-locked loop (PLL) circuit via a matching delay circuit (MDEL1) 121. In the illustrated embodiment, 3 separate PLLs are shown including PLL1 115, PLL2 117 and PLL3 119. Although 3 PLLs are shown, any number of PLLs, more or less than 3, may be included.

Three additional clock paths are shown between the PAD 111 and the PLLs 115-119, including a first feedback clock signal F1 from PAD 111 to the feedback clock input (F) of the PLL1 115 via MDEL1 123, a second feedback clock signal F2 from PAD 111 to the feedback clock input of the PLL2 117 via MDEL1 125, and a third feedback clock signal F3 from PAD 111 to the feedback clock input of the PLL3 119 via MDEL1 127.

In the illustrated embodiment, the PAD 111 is separated from the PLLs 115-119 by a distance across the chip. The clock paths carrying the clock signals RCLK and F1-F3 include conductive traces and vias and the like, and may further include one or more buffers to boost the respective clock signals if needed or desired. Each buffer may be implemented as non-inverting or inverting (e.g., inverter). The conductive material (e.g., metal) of the conductive traces and vias and the like include electrical parasitics (e.g., resistance, capacitance, inductance) that may cause signal degradation and delays or the like. Each buffer in the signal path also adds delay. Since the PLLs 115-119 attempt to align frequency and/or phase of each of the clock signals at the PAD 111, it is desired that the clock paths match each other to the extent possible. The matching delay circuits MDEL1 121-127 represent the matching of the delay to minimize differences of delays between the clock paths.

The matching delay circuits MDEL1 121, 123, 125 and 127 are configured, adjusted or otherwise programmed to match the delay of each of the feedback clock signals F1-F3 and the reference clock signal RCLK between the PAD 111 and the corresponding reference and feedback clock inputs of each of the PLLs. Each MDEL1 121-127 may incorporate any number of buffers or inverters or other delay components or blocks for matching delays with the other clock paths, taking into account delays associated with the parasitics of the intermediate conductive traces and vias and the like. The components of each MDEL1 circuit are configured to match delay as close as possible with the other signal paths. In one embodiment, each MDEL1 121-127 may be configured in an identical manner, but one or more may further be tweaked or adjusted or the like to achieve matched delay for the F1-F3 signals. In this manner, the delays of the signals RCLK, F1, F2 and F3 between the PAD 111 and the PLLs are essentially the same.

In one embodiment, clock signals are routed in corresponding clock trees or the like with clock paths that are matched with each other using a manual process. For example, similar or identical conductive paths may be used along with the same number and distribution of buffers or the like. Such signal path matching is known to those of ordinary skill in the art. As the complexity of technologies has increased, newer manufacturing methods may also be employed, such as clock tree synthesis or the like, to route clock signals. Clock tree synthesis may be manual or automatic in which it is desired to match the overall delay to the extent possible over time, voltage and temperature variations.

The PLL1 115 generates a first clock signal C1 via an MDEL2 131 to a clock distribution circuit 129, the PLL2 117 generates a second clock signal C2 via an MDEL2 133 to the clock distribution circuit 129, and the PLL3 119 generates a third clock signal C3 via an MDEL2 135 to the clock distribution circuit 129. The MDEL2s 131-135 are not necessarily the same as the MDEL1s 121-127. Instead, the MDEL2s 131-135 are configured to match the delay of each other. The MDEL2s 131-135 are configured, adjusted or otherwise programmed to match the delay of each of the paths between the PLLs 115, 117 and 119 and the clock distribution circuit 129 using clock tree synthesis or the like in a similar manner previously described. In this manner, the signal delays of the clock signals C1-C3 between the PLLs 115-119 and the clock distribution circuit 129 are essentially the same.

The clock distribution circuit 129 provides a feedback clock signal for each of the clock signals C1-C3 through corresponding matched delay paths to the PAD 111. As shown, the clock distribution circuit 129 provides a first feedback clock signal FB1 for clock signal C1 to the PAD 111 via MDEL3 137, the clock distribution circuit 129 provides a second feedback clock signal FB2 for clock signal C2 to the PAD 111 via MDEL3 139, and the clock distribution circuit 129 provides a third feedback clock signal FB3 for clock signal C3 to the PAD 111 via MDEL3 141. Again, the MDEL3s 137-141 are not necessarily the same as the MDEL1s 121-127 or the MDEL2s 131-135. Instead, the MDEL2s 137-141 are configured to match the delay of each other. The MDEL3 137-141 are configured, adjusted or otherwise programmed to match the delay of each of the paths between the clock distribution circuit 129 and the PAD 111 using clock tree synthesis or the like in a similar manner previously described. In this manner, the signal delays of the clock signals FB1-FB3 between the clock distribution circuit 129 and the PAD 111 are essentially the same.

The clock distribution circuit 129 is shown with internal dotted lines representing feedback paths between clock pairs C1/FB1, C2/FB2 and C3/FB3. The delays of the internal paths of the clock distribution circuit 129 are effectively matched with each other. In a similar manner, the PAD 111 is shown with internal dotted lines representing feedback paths between clock pairs FB1/F1, FB2/F2 and FB3/F3, in which the delays of the internal paths of the PAD 111 are effectively matched with each other.

The PLL1 115 operates to align the phase relationship between the reference clock RCLK and the feedback clock F1. Since the delay between the PAD 111 and the PLL1 115 is matched, the PLL1 115 effectively aligns the phases between the feedback clock signal FB1 and RCLK at the PAD 111. Although not explicitly shown, the PLL1 115 includes a programmable internal frequency divider to divide the frequency of F1 down by a selected multiplier to effectively match the frequency of RCLK. The frequency of the RCLK is effectively multiplied by the programmed multiplier to determine the frequency of the output clock signal C1, and thus the frequency of the clock signals FB1 and F1.

The PLL2 117 operates in similar manner to align the phase relationship between the reference clock RCLK and the feedback clock F2 by aligning the phases between the feedback clock signal FB2 and RCLK at the PAD 111. The PLL2 117 also incorporates a programmable internal frequency divider to select a multiplier to determine the frequency of the clock signals C2, FB2 and F2.

The PLL3 119 also operates in similar manner to align the phase relationship between the reference clock RCLK and the feedback clock F3 by aligning the phases between the feedback clock signal FB3 and RCLK at the PAD 111. The PLL3 119 also incorporates a programmable internal frequency divider to select a multiplier to determine the frequency of the clock signals C2, FB2 and F2. The selected multipliers between the PLLs 115-119 may be the same or different at any given time.

The clock distribution circuit 129 further provides a functional clock signal CORE_CK to the core 105 and the uncore circuitry 107 via an MDEL3 143, and provides another functional clock signal IO_CK to the I/O circuitry 109 via another MDEL3 145. A "functional" clock signal as used herein is intended to mean that the clock signal is routed to functional blocks or circuitry or the like of the system for synchronization or timing purposes or the like. Generally, the CORE_CK and IO_CK functional clock signals are routed to their respective functional blocks using any suitable clock distribution and routing methodology or algorithm or the like to deliver the respective clock signals. Since it is desired to match the timing of each clock edge as close as possible between the core 105, the uncore circuitry 107, and the I/O circuitry 109 for synchronization and timing purposes, MDEL3 143 and 145 are both configured or otherwise adjusted or programmed to match the timing delay of the clock paths delivering the CORE_CK and IO_CK signals.

Since the PLLs 115-119 are used to align phase and frequency of the clock signals, the delay of each of the feedback clock paths delivering the feedback clocks FB1-FB3 should also match the delays of CORE_CK and IO_CK. In this manner, MDEL3s 137-145 are configured, adjusted or otherwise programmed so that the delay of each of the feedback clock signals FB1-FB3 match each other and the delay of both the CORE_CK and the IO_CK using clock tree synthesis or the like in a similar manner previously described. In this manner, it is intended that the operative clock edges at the core 105, the uncore circuitry 107 and the I/O circuitry 109 along with the feedback clock signals FB1-FB3 are coincident.

The clock distribution circuit 129 includes clock select or multiplexer (MUX) circuitry or the like (not shown) for selecting between the input clock signals C1-C3 to drive the clock signals CORE_CK and IO_CK. The feedback clock signals FB1-FB3 are generally "un-gated" meaning that they remain on to maintain frequency and phase alignment of the clock signals. In one embodiment, the clock signal C3 is a dedicated I/O clock signal to develop the IO CLK for the I/O circuitry 109 when gated on. In a low power state, the clock distribution circuit 129 may disable IO CLK while C3 remains driven by the PLL3 119 via feedback clock FB3.

In one embodiment, the clock distribution circuit 129 selects between clock signals C1 and C2 for driving the CORE_CK signal. The other PLL not driving CORE_CK may be reprogrammed to a different multiplier for clock adjustment. For example, while PLL1 115 is selected to drive CORE_CK, the multiplier of the PLL2 117 may be reprogrammed higher or lower. When the new clock frequency of PLL2 117 has stabilized, the clock distribution circuit 129 may switch to the PLL2 117 for driving CORE_CK, so that PLL1 115 may be re-programmed to another multiplier if desired. Operation may toggle between PLL1 and PLL2 in this manner to walk the frequency of the CORE_CK signal up or down in as understood by those of ordinary skill in the art. The clock distribution circuit 129 may also gate the CORE_CK off during a low power state if desired.

In one more specific embodiment, BCLK has a frequency in the range of 100 Megahertz (MHz) to 400 MHz, and the clock signals C1-C3 operate in the range of about 0.40 Gigahertz (GHz) to about 3 GHz. Although BCLK may be passed to RCLK with the same frequency, RCLK may also be one-half the frequency of BCLK by operation of the frequency divider 113. The PLLs 115-119 may have a suitable range of multipliers for multiplying the frequency of RCLK to the desired frequency range. In one embodiment, the multipliers range from 2× to 32× although any suitable multiplier range is contemplated.

Although the clock generation circuitry 103 provides considerable flexibility for developing the functional clock signals for driving the core 105 and the other circuitry on the IC 101 (e.g., uncore and I/O), jitter propagates through the system reducing overall efficiency and performance. BCLK typically incorporates a certain level of input jitter, which is passed to RCLK and to the reference input of the PLLs. The feedback clock paths generating the feedback signals FB1-FB3 traverse a significant portion of the IC 101 and thus are exposed to significant supply voltage variations of VDD and VSS across the chip, along with other variations across the chip, such as temperature gradients or the like. These variations contribute to input jitter provided at the feedback inputs of the PLLs 115-119. Furthermore, the PLLs 115-119 develop internal jitter which contributes to the overall jitter.

In a conventional configuration, the bandwidth of each of the PLLs 115-119 may be adjusted in an attempt to reduce overall jitter as much as possible. The bandwidth of a PLL generally refers to its response to input frequencies and may or may not be dependent upon its output frequency range. The bandwidth of each of the PLLs 115-119 is determined and may be adjusted based on a particular configuration to reduce jitter. The lower the bandwidth of the PLLs 115-119, the greater the attenuation of input jitter. The lower the bandwidth, however, the less the attenuation of internal jitter generated within the PLLs 115-119.

If the bandwidth of each of the PLLs 115-119 is reduced to minimize input jitter, then the internal jitter is generally passed through unfiltered so that a jitter problem still exists. Alternatively, if the bandwidth of the PLLs 115-119 is increased to relatively high levels in an attempt to minimize internal jitter, the high bandwidth PLLs do not filter the input jitter, so that the jitter problem still exists. Thus, the designer of each PLL was forced to compromise on the bandwidth and was unable to reduce both types of jitter at the same time. In this manner, the clock generation circuitry 103 suffered from a significant amount of jitter which reduced the overall efficiency and performance of the IC 103.

Figure 2:
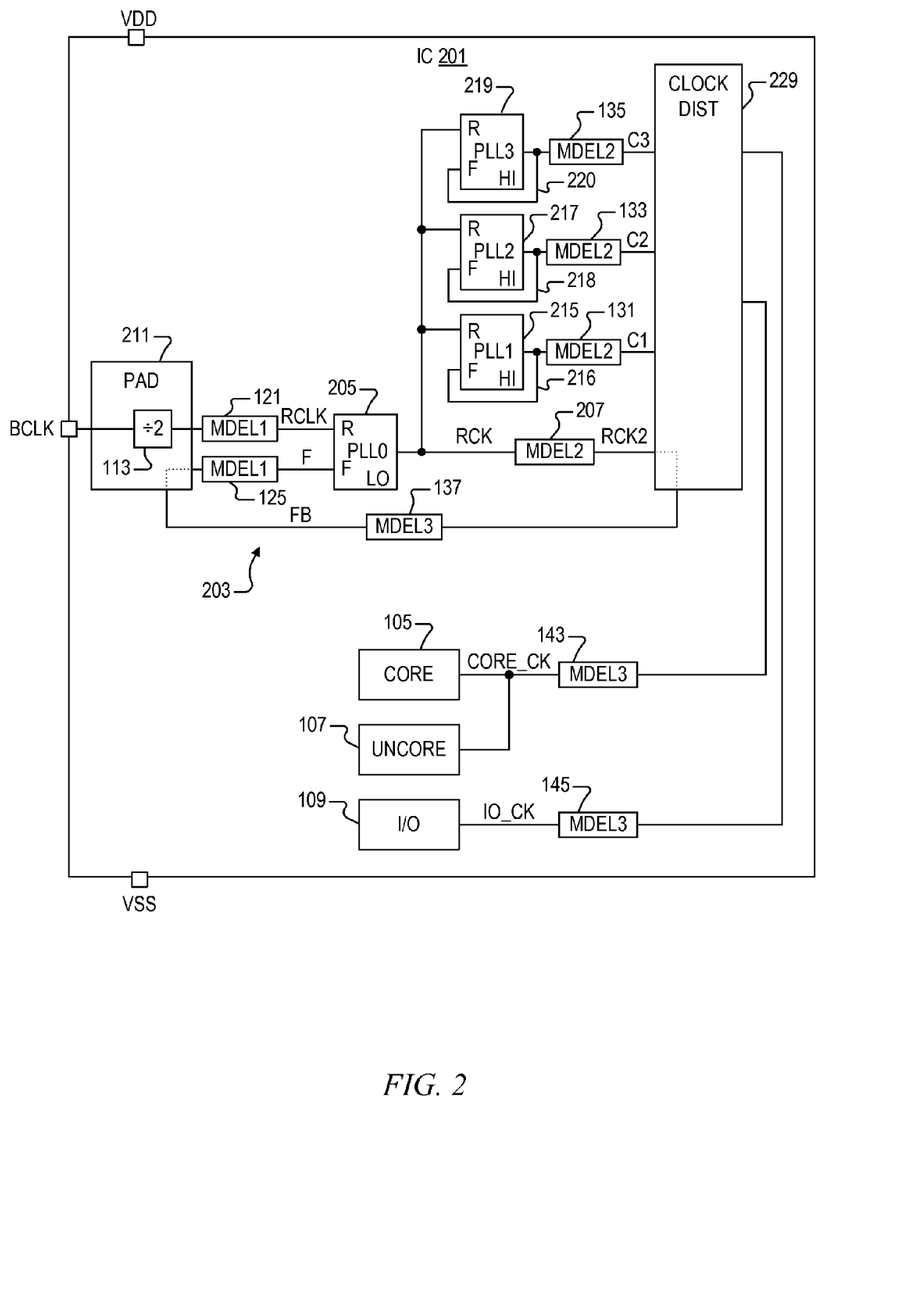
FIG. 2 is a simplified block diagram of an IC incorporating clock generation circuitry implemented according to an embodiment of the present invention for reducing overall jitter, including both input and internal jitter.

FIG. 2 is a simplified block diagram of an IC 201 incorporating clock generation circuitry 203 implemented according to an embodiment of the present invention for reducing overall jitter, including both input and internal jitter. The IC 201 is similar to the IC 101 in that it may also include electronic circuitry configured to perform any suitable electronic function, such as processing or communications or the like. Similar components assume identical reference numbers. For example, the IC 201 is also shown implemented as a microprocessor chip including the core 105, the uncore circuitry 107, and the I/O circuitry 109. Additional functional blocks may be included in particular configurations and a multi-core microprocessor is contemplated in which the core 105 may represent one or more microprocessor cores. VDD, VSS and BCLK are shown and provided in similar manner.

The PAD 111 is replaced by a PAD 211 for receiving BCLK and conveying the reference clock signal RCLK via MDEL1 121 in similar manner as the IC 101, in which the PAD 211 is also an alignment location. In this case, however, RCLK is provided to the reference input of a low bandwidth PLL0 205. The PLL0 205 is denoted as "LO" indicating that it is configured with a relatively low bandwidth. The PLL0 205 may operate in the frequency range of BCLK and/or RCLK. In one embodiment, for example, the PLL0 205 operates in the 100-400 MHz range rather than in the GHz range. Although the PLL0 205 may be implemented with a multiplier in similar manner as previously described, in one embodiment the PLL0 205 is a 1:1 PLL providing an output reference clock signal RCK having the same frequency as RCLK.

The PLLs 115-119 are replaced by corresponding PLLs 215, 217, and 219 (215-219), which are configured and designated as high bandwidth PLLs and are each denoted as "HI." The high bandwidth PLLs 215-219 are provided in similar manner as the PLLs 115-119, except that each receives RCK at their respective reference clock inputs rather than receiving RCLK. In one embodiment, each of the PLLs 215-219 operate in the 400 MHz-3 GHz range, although any suitable frequency range is contemplated. The clock distribution circuit 129 is replaced by a clock distribution circuit 229, which is similar in that it receives the clock signals C1-C3 and provides the functional clock signals CORE_CK via MDEL3 143 and IO_CK via MDEL3 145 in similar manner. Again, C3 is used to provide IO_CK and a selected one of C1 and C2 is used to provide CORE_CK. The PLL1 215 provides the clock signal C1 via MDEL2 131 in similar manner, the PLL2 217 provides the clock signal C2 via MDEL2 133 in similar manner, and PLL3 219 provides the clock signal C3 via MDEL2 135 in similar manner, each to the clock distribution circuit 229.

In this case for the clock generation circuitry 203, RCK is provided through an MDEL2 207 to provide a slightly delayed reference clock signal RCK2 to another input of the clock distribution circuit 229. MDEL2 207 is configured, adjusted or otherwise programmed so that the delay of the clock path of RCK and RCK2 matches the delays of each of the clock paths between the PLLs 215-219 and the clock generation circuitry 203 in a similar manner previously described.

It is noted that RCK is shown directly coupled to the reference inputs of the high bandwidth PLLs 215-219 and to MDEL2 207. In this case, the PLL0 205 and the PLLs 215-219 are co-located in which the conductive paths carrying RCK are relatively short with minimal delay and subject to the same temperatures and voltages. If the PLLs 215-219 are separated from each other or from the PLL0 205 by an appreciable amount, then the corresponding clock paths may be matched with each other (e.g., as represented using MDEL circuitry or the like) to minimize differences in delay of RCK.

The clock generation circuitry 203 is simplified in that only a single feedback path is provided for RCK2 through MDEL3 137 to provide a signal feedback clock path for a feedback clock signal FB. The delay path of MDEL3 137 is configured, adjusted or otherwise programmed to match the delays of the delay paths MDEL3 143 and 145 in similar manner as previously described. FB is provided to an input of the PAD 211, which conveys FB to the PLL0 205 as a feedback signal F via MDEL1 125. MDEL1s 121 and 125 are configured, adjusted or otherwise programmed so that their respective delays match each other between the PAD 211 and the PLL0 205 using clock tree synthesis or the like in a similar manner previously described. The single feedback signal F is provided to the feedback clock input of the PLL0 205.

In this manner, the distributed feedback paths for each of the high bandwidth PLLs 215-219 providing corresponding feedback signals FB1-FB3 are eliminated. Instead, the single feedback path providing the single feedback signal F is provided to the low bandwidth PLL0 205. Input jitter developed on the feedback signal F is effectively filtered by the low bandwidth PLL0 205. Furthermore, any input jitter on RCLK is also effectively filtered by the low bandwidth PLL0 205, so that the output reference clock signal RCK is a "filtered" signal with substantially reduced input jitter. The bandwidth of the PLL0 205 may be selected, configured, adjusted or otherwise programmed to reduce or otherwise eliminate the input jitter.

The bandwidth of the high bandwidth PLLs 215-219 may be selected, configured, adjusted or otherwise programmed to reduce or otherwise eliminate internal jitter internally generated within the PLLs. In this manner, both types of jitter are effectively reduced or otherwise substantially eliminated by the combination of the low and high bandwidth PLLs. In other words, the designer may adjust the bandwidth of the PLL0 205 and that of the PLLs 215-219 to reduce the overall jitter without having to compromise between the two types of jitter.

Furthermore, the feedback paths for each of the high bandwidth PLLs 215-219 is a direct connection between the respective outputs and feedback inputs. As shown, a feedback path 216 is provided between the output and the feedback clock input of the PLL1 215, a feedback path 218 is provided between the output and the feedback clock input of the PLL2 217, and a feedback path 220 is provided between the output and the feedback clock input of the PLL3 219. Thus, the jitter laden feedback signals F1-F3 provided to the feedback clock inputs of the high bandwidth PLLs 215-219 are eliminated. In this manner, the feedback paths for each of the high bandwidth PLLs 215-219 are not distributed across the chip but are instead provided directly or locally back to their inputs via substantially jitter-free conductive paths.

Each feedback path 216-220 is a "direct" or "local" connection, meaning that each connection traverses a relatively short distance and is not subjected to any significant supply voltage variations or temperature gradients. In general, these local paths are not subjected to and are effectively isolated from source of jitter. Also, in one embodiment there are no delay components in the feedback paths other than a conductive trace or path so that any jitter sources are eliminated. Although delay components might be used in some cases to eliminate any delay discrepancies if desired, any such components are local with respect to the corresponding high bandwidth PLL and thus subjected to the same voltages and temperatures. Thus, in either case, any jitter-causing influences of the feedback paths are substantially eliminated.

In summary, the low bandwidth PLL0 205 operates to filter input jitter, whereas each of the high bandwidth PLLs 215-219 operates to filter the internal jitter generated within the PLLs. Thus, the designer may configure, program or adjust the bandwidth of the PLL0 205 to reduce or eliminate input jitter and may configure, program or adjust the bandwidths of the PLLs 215-219 to reduce or eliminate internal jitter.

In general, the bandwidth of the low bandwidth PLL is less than the bandwidth of the one or more high bandwidth PLLs. In one embodiment, for example, the PLL0 205 has a bandwidth of approximately 1 MHz, whereas the bandwidth of the PLLs 215-219 are configured with a bandwidth of about 5 MHz. There is, however, no restriction regarding the relative ratio of bandwidths between the low and high bandwidth PLLs. The designer has substantial flexibility to adjust PLL bandwidth to minimize overall jitter within the clock system, including input jitter and internal jitter.

Figure 3:
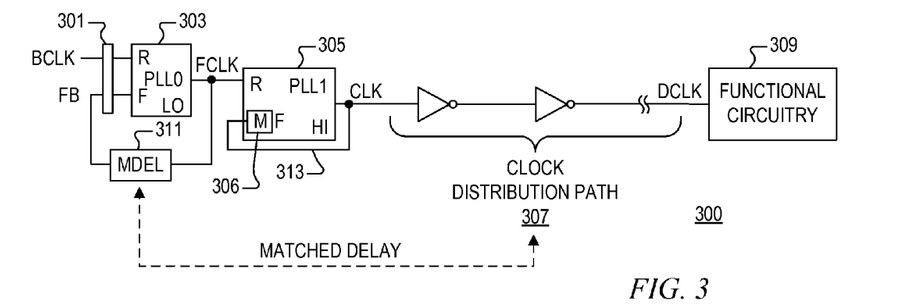
FIG. 3 is a simplified block diagram of a clock system implemented according to another embodiment of the present invention for reducing overall jitter.

FIG. 3 is a simplified block diagram of a clock system 300 implemented according to another embodiment of the present invention for reducing overall jitter. BCLK and a feedback clock FB are provided through an alignment location 301 to the reference and feedback inputs, respectively, of a low bandwidth PLL0 303. In this case, the alignment location 301 is sufficiently close to the inputs of the low bandwidth PLL0 303 so that there is negligible delay between the alignment location 301 and the PLL0 303.

The PLL0 303 outputs a filtered clock signal FCLK, which is provided to the reference input of a high bandwidth PLL1 305. In this case, only one high bandwidth PLL is shown, the PLL1 305, which has an output providing a functional clock signal CLK. The PLL1 305 has a local feedback path 313 coupled between its output and its feedback input and thus exposed to negligible jitter sources or otherwise exposed to the same conditions as the PLL1 305. The feedback input of the PLL1 305 is also shown with a programmable divider 306 which multiplies the frequency of the functional clock CLK by a factor M relative to the frequency of FCLK. The bandwidth of the PLL0 303 is made sufficiently low to filter input jitter, whereas the bandwidth of the PLL1 305 is made sufficiently high to filter internal jitter.

CLK is distributed to functional circuitry 309 via a clock distribution path 307. As previously described, the functional circuitry 309 may be separated from the PLL1 305, so that the clock distribution path 307 may expose the functional clock signal to significant sources of jitter. The clock distribution path 307 may include any number of buffers or the like and intermediate conductive paths incorporating parasitics and the like, thereby subjecting the clock distribution path 307 to temperature gradients and/or voltage differences contributing to significant jitter. Thus, the clock distribution path 307 incorporates delay so that the CLK signal arrives at the functional circuitry 309 as a delayed clock signal DCLK.

In order to align the phase and/or frequency at the alignment location 301, the feedback path between the output of the PLL0 and the alignment location 301 (or the feedback input of the PLL0) is configured with a delay path, shown as MDEL 311, that is configured, adjusted or otherwise programmed to match the clock distribution path 307. The bandwidth of the PLL0 is configured or selected to reduce or minimize input jitter, and the bandwidth of PLL1 is configured to selected to reduce or minimize internal jitter. In this manner, phase and/or frequency alignment is achieved and overall jitter is reduced or otherwise minimized.

Figure 4:
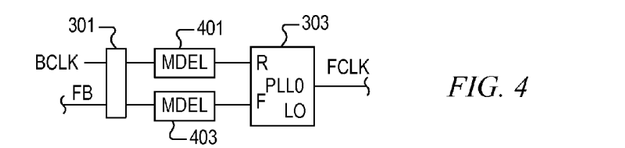
FIG. 4 is a simplified block diagram of the clock system of FIG. 3 according to an alternative embodiment in which the alignment location is separated from the low bandwidth PLL.

FIG. 4 is a simplified block diagram of the clock system 300 according to an alternative embodiment in which the alignment location 301 is separated from the PLL0 303. In this case, matched delay circuits MDEL 401 and 403 are interposed along the clock paths conveying BCLK and FB in a similar manner as described above for the matched delay circuits MDEL1 121 and 125 of the IC 201.

Figure 5:
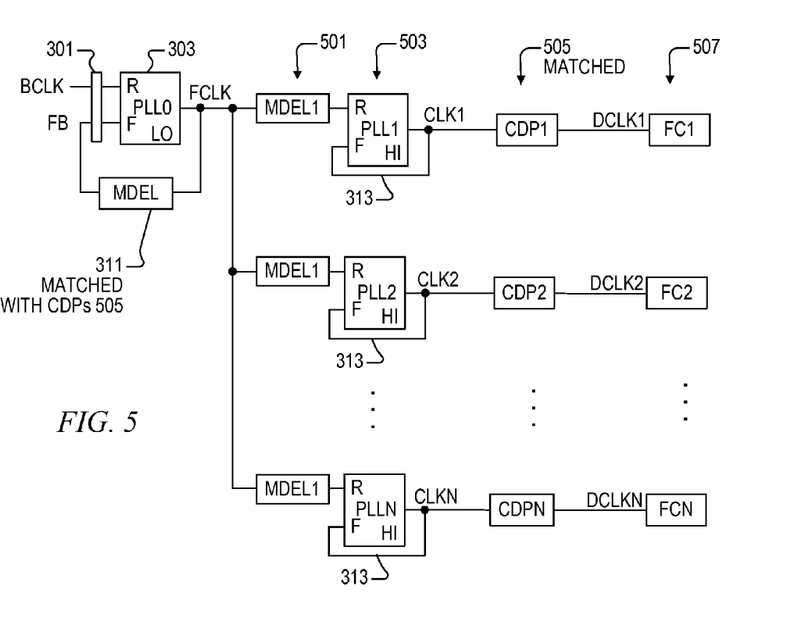
FIG. 5 is a simplified block diagram of the clock system of FIG. 3 according to an alternative embodiment including multiple high bandwidth PLLs.

FIG. 5 is a simplified block diagram of the clock system 300 according to an alternative embodiment including an integer number "N" of high bandwidth PLLs 503, shown as PLL1, PLL2, . . . , PLLN. Each of the PLLs includes a local "low jitter" feedback path 313 from its output to its feedback input. Assuming that the high bandwidth PLLs 503 are separated from the low bandwidth PLL0 303, then the filtered clock signal FCLK is distributed via respective matched delay circuits MDEL1 501 as shown. The high bandwidth PLLs 503 provide a corresponding number N of functional clock signals CLK1, CLK2, . . . CLKN to a corresponding number N of functional circuits 507, shown as FC1, FC1, . . . , FCN, via corresponding matched clock distribution paths 505, shown as CDP1, CDP2, . . . , CDPN, resulting in corresponding delayed clock signals shown as DCLK1, DCLK2, . . . DCLKN, provided to the functional circuits 507. As previously described, the clock distribution paths 505 are matched with each other and the matching delay circuit MDEL 311 is configured, adjusted or otherwise programmed to match each of the clock distribution paths 505.

It is noted that the bandwidth of each of the high bandwidth PLLs PLL1-PLLN may be the same as each other. Alternatively, the bandwidth of the high bandwidth PLLs may be tweaked based on measured or empirically determined jitter along the clock distribution paths 505 and the common PLL feedback loop.

Although the present invention has been described in considerable detail with reference to certain preferred versions thereof, other versions and variations are possible and contemplated. For example, the circuits described herein may be implemented in any suitable manner including logic devices or circuitry or the like. Any number of the functions described for the logic circuits may be implemented in software or firmware within an integrated device. Those skilled in the art should appreciate that they can readily use the disclosed conception and specific embodiments as a basis for designing or modifying other structures for carrying out the same purposes of the present invention without departing from the spirit and scope of the invention.

What is claimed is:

1. A clock system that receives a reference clock signal via an alignment location and that develops a functional clock signal, wherein the functional clock signal is provided to a functional circuit via a clock path, comprising:
   a low bandwidth PLL having a reference input for receiving the reference clock signal, having a feedback input receiving a feedback clock signal, and having an output providing a filtered clock signal;
   a high bandwidth PLL having a reference input receiving said filtered clock signal, having an output for providing the functional clock signal, and having a feedback input coupled to said output of said high bandwidth PLL via a local feedback path; and
   a delay path coupled between said output of said low bandwidth PLL and the alignment location for providing said feedback clock signal to said low bandwidth PLL, wherein said delay path is configured to have a delay that substantially matches the clock path carrying the functional clock signal.

2. The clock system of claim 1, wherein a bandwidth of said low bandwidth PLL is selected to reduce input jitter, and wherein a bandwidth of said high bandwidth PLL is selected to reduce internal jitter.

3. The clock system of claim 1, wherein said low bandwidth PLL generates said filtered clock signal at a frequency that is approximately the same as a frequency of the reference clock signal, and wherein said high bandwidth PLL generates said functional clock signal at a frequency that is greater than a frequency of the filtered clock signal.

4. The clock system of claim 1, wherein said local feedback path is exposed to substantially the same voltages and substantially the same temperatures as said high bandwidth PLL.

5. The clock system of claim 1, wherein said delay path is configured to have substantially the same timing delay and electrical characteristics as the clock path.

6. The clock system of claim 1, wherein said delay path is configured to have the same number of buffers as the clock path.

7. The clock system of claim 1, further comprising:
   a pad forming the alignment location;
   a reference clock path coupled between said pad and said reference input of said low bandwidth PLL for carrying the reference clock signal;
   a feedback clock path coupled between said pad and said feedback input of said low bandwidth PLL for carrying said feedback clock signal; and
   wherein said reference clock path and said feedback clock path are configured to substantially match each other.

8. The clock system of claim 1, wherein the functional clock signal includes a plurality of functional clock signals provided to a plurality of functional circuits via a plurality of clock paths, and wherein said high bandwidth PLL comprises plurality of high bandwidth PLLs, each having a reference input receiving said filtered clock signal, each having an output for providing a corresponding one of the plurality of functional clock signals, and each having a feedback input coupled a corresponding output via a corresponding one of a plurality of a local feedback paths.

9. The clock system of claim 8, wherein each of said plurality of clock paths are configured to substantially match each other and to match said delay path.

10. The clock system of claim 1, further comprising:
    a clock distribution circuit;
    wherein said high bandwidth PLL comprises plurality of high bandwidth PLLs, each having a reference input receiving said filtered clock signal, each having an output for providing a corresponding one of a plurality of selectable clock signals to said clock distribution circuit, and each having a feedback input coupled a corresponding output via a corresponding one of a plurality of a local feedback paths; and
    wherein said clock distribution circuit selects one of said selectable clock signals as said functional clock signal.

11. The clock system of claim 10, wherein each of said plurality of selectable clock signals and said filtered clock signal are conveyed along a corresponding one of a plurality of matched clock paths between said low bandwidth PLL and said plurality of high bandwidth PLLs and said clock distribution circuit.

12. An integrated circuit, comprising:
    at least one functional circuit;
    a pad receiving and forwarding an external reference clock signal and receiving and forwarding a feedback clock signal;
    a low bandwidth PLL having a reference input receiving said reference clock signal, having a feedback input receiving said feedback clock signal, and having an output providing a filtered clock signal;
    at least one high bandwidth PLL, each having a reference input receiving said filtered clock signal, each having an output providing a corresponding one of at least one functional clock signal, and each having a feedback input coupled to said output via a local feedback path;
    at least one clock distribution path, each conveying a corresponding one of said at least one functional clock signal to a corresponding one of said at least one functional circuit; and
    a feedback clock path coupled between said output of said low bandwidth PLL and an input of said pad providing said feedback clock signal, wherein said feedback clock path is matched with each of said at least one clock distribution path.

13. The integrated circuit of claim 12, further comprising a pair of matched clock paths for conveying said reference clock signal and said feedback clock signal from said pad to said reference input and said feedback input of said low bandwidth PLL, respectively.

14. The integrated circuit of claim 12, wherein said at least one high bandwidth PLL comprises a plurality of high bandwidth PLLs, and wherein said filtered clock signal is conveyed along each of a plurality of matched clock paths to respective reference inputs of said plurality of high bandwidth PLLs.

15. The integrated circuit of claim 12, wherein said at least one high bandwidth PLL comprises a plurality of high bandwidth PLLs each providing a corresponding one of a plurality of functional clock signals, wherein said at least one clock distribution path comprises a plurality of matched clock distribution paths, and wherein each of said plurality of functional clock signals is conveyed along a corresponding one of said plurality of matched clock distribution paths.

16. The integrated circuit of claim 12, further comprising:
said at least one high bandwidth PLL comprising a plurality of high bandwidth PLLs each providing a corresponding one of a plurality of functional clock signals;
clock distribution circuitry; and
a plurality of matched clock paths that convey said plurality of functional clock signals from said plurality of high bandwidth PLLs to said clock distribution circuitry, and that conveys said feedback clock signal from said low bandwidth PLL to said clock distribution circuitry.

17. The integrated circuit of claim 16, wherein said clock distribution circuitry comprises select logic which selects from among said plurality of functional clock signals to convey a selected functional clock signal along said at least one clock distribution path to said at least one functional circuit, and wherein said feedback clock path is coupled between said clock distribution circuitry and said pad.

18. The integrated circuit of claim 12, wherein a bandwidth of each of said at least one high bandwidth PLL is selected to reduce internal jitter, and wherein a bandwidth of said low bandwidth PLL is selected to reduce input jitter.

19. The integrated circuit of claim 12, wherein said local feedback path of each of said at least one high bandwidth PLL is isolated from jitter producing sources of the integrated circuit.

20. The integrated circuit of claim 12, wherein said at least one functional circuit comprises a microprocessor core, and wherein said at least one functional clock signal comprises at least one core clock signal.

21. A method of reducing jitter of a clock signal of a clock system, comprising:
filtering a reference clock and a feedback clock received from an alignment location using a low bandwidth PLL which provides a filtered clock;
conveying the filtered clock to the reference input of a high bandwidth PLL that provides a functional clock via an output;
coupling the output and a feedback input of the high bandwidth PLL together via a local path;
conveying the functional clock to a functional block along a clock distribution path;
providing a feedback path that is matched with the clock distribution path from the low bandwidth PLL to the alignment location; and
conveying the filtered clock on the feedback path to provide the feedback clock to the low bandwidth PLL.

22. The method of claim 21, further comprising conveying the reference clock and the feedback clock from the alignment location to the low bandwidth PLL via matching paths.

23. The method of claim 21, further comprising:
configuring a bandwidth of the low bandwidth PLL to reduce input jitter; and
configuring a bandwidth of the high bandwidth PLL to reduce internal jitter.

24. The method of claim 21, wherein said coupling the output and a feedback input of the high bandwidth PLL together via a local path comprises providing the local path within the same temperature gradients and voltages as the high bandwidth PLL.

* * * * *